(12) United States Patent
Correa et al.

(10) Patent No.: US 8,736,365 B2
(45) Date of Patent: May 27, 2014

(54) BROADBAND LINEARIZATION MODULE AND METHOD

(75) Inventors: Paulo Correa, Dana Point, CA (US); Andre A. Castro, Irvine, CA (US)

(73) Assignee: Empower RF Systems, Inc., Inglewood, CA (US)

( * ) Notice: Subject to any disclaimer, the term of this patent is extended or adjusted under 35 U.S.C. 154(b) by 87 days.

(21) Appl. No.: 13/285,972

(22) Filed: Oct. 31, 2011

(65) Prior Publication Data

US 2012/0194270 A1 Aug. 2, 2012

Related U.S. Application Data

(60) Provisional application No. 61/409,035, filed on Nov. 1, 2010.

(51) Int. Cl.
*H03F 1/26* (2006.01)
(52) U.S. Cl.
USPC ................... 330/149; 330/124 R; 330/53

(58) Field of Classification Search
USPC .................. 330/149, 53, 124 R
See application file for complete search history.

(56) References Cited

U.S. PATENT DOCUMENTS

| | | | |
|---|---|---|---|
| 6,646,505 B2* | 11/2003 | Anderson et al. | 330/124 R |
| 7,535,297 B2* | 5/2009 | Chen et al. | 330/129 |
| 7,755,425 B2* | 7/2010 | Klingberg et al. | 330/149 |
| 7,961,045 B2* | 6/2011 | Morris et al. | 330/149 |
| 8,154,339 B2* | 4/2012 | Zolghadri et al. | 330/124 R |
| 2003/0092462 A1* | 5/2003 | Dartois | 455/522 |
| 2012/0219048 A1* | 8/2012 | Camuffo et al. | 375/224 |

* cited by examiner

*Primary Examiner* — Patricia Nguyen
(74) *Attorney, Agent, or Firm* — Wilmer Cutler Pickering Hale and Dorr LLP

(57) ABSTRACT

A system including a power amplifier and a pre-distortion module coupled to the power amplifier. The pre-distortion module includes one or more smaller versions of the power amplifier to generate a pre-distortion signal that compensates for any memory-effect or inertia present in the power amplifier with application on frequency hopping and larger (up to 1 octave) instantaneous bandwidth communication systems.

19 Claims, 2 Drawing Sheets

BROADBAND LINEARIZATION MODULE AND METHOD

CROSS REFERENCE TO RELATED APPLICATION

This application claims the benefit under 35 U.S.C. §119(e) of U.S. Provisional Patent Application No. 61/409,035, filed Nov. 1, 2010, which is hereby incorporated by reference herein in its entirety.

FIELD OF THE INVENTION

This invention relates generally to power amplifiers and methods for linearizing the output from these power amplifiers.

BACKGROUND

New communication services and the use of complex waveforms have created a demand for highly linearized power amplifiers. Deviations from linearity are manifest by spectral distortion components in the output of these amplifiers—that is, undesired energy, not contained in the original signal, inside or outside the frequency band of interest. Linearization techniques seek to reduce these distortion components, restoring signal integrity and allowing an amplifier to operate at its best spectral and power efficiency for the specific application.

To date, a number of linearization approaches have been attempted. Most of these techniques, however, are useful only in circumstances where the input signals occupy low-percentage bandwidths (typically 10% or less) or do not change frequency rapidly over time.

For example, existing digital pre-distortion (DPD) techniques, which use non-linear transfer characteristics of an amplifier in order to generate inverse distortion products that can be supplied along with input signals to the amplifier, require time to converge and must have access to the baseband or digital intermediate frequency (IF) signal components (I and Q or $IF_I$ and $IF_Q$). Moreover, digital signal processors, ASICS or FPGAs used in DPD-based designs tend to be limited in bandwidth (due to their clock frequencies) and processing capacity.

Current analog pre-distortion techniques are likewise limited in bandwidth and require adjustment when the input signal center frequency is changed. Adaptive linearization can eliminate the limitations to the change in the center frequency of these designs, but tend to be slow to respond to changes in system characteristics and can be very complex to implement.

Feed-forward linearization techniques are also complex to implement (often making them unsuitable for use with existing amplifiers), are limited in bandwidth and often do not provide significant gains in efficiency because of the relatively high power consumption of the error or auxiliary amplifier. Other conventional linearization solutions, such as power back-off schemes, envelope elimination and restoration designs, linear amplification using nonlinear components, and Cartesian feedback designs all have their own limitations as well. In addition, the increasing complexity of semiconductor-based power amplifiers has memory effect or inertia and therefore limits the use of converging linearization techniques in frequency hopping applications due to the reaction time to correct.

SUMMARY OF INVENTION

According to one embodiment, the apparatus of the invention includes a power amplifier device and a pre-distortion module. The pre-distortion module is coupled with the power amplifier device, and the pre-distortion module can generate a pre-distortion signal. The pre-distortion module includes one or more basic amplification cells that are the same as one or more basic amplification cells in the power amplifier device. The basic amplification cells can be, for example, transistors or the finite element that forms the transistor to be corrected. The pre-distortion signal is, therefore, a correction signal that can be matched to the non-linearity of the power amplifier device, and the pre-distorted signal can be the input to the power amplifier device. The power amplifier device and the pre-distortion module are thermally coupled to avoid thermally induced variances. In use, the pre-distortion signal is a correction signal that is matched to the non-linearity of the power amplifier device.

In another embodiment the invention includes a pre-distortion module that is adapted for coupling to a power amplifier device during use. In this embodiment, the pre-distortion module includes one or more basic amplification cells that are the same as one or more basic amplification cells in the power amplifier device to generate a pre-distortion signal for the power amplifier device.

In yet another embodiment, the invention includes a system including a power amplifier and a pre-distortion module coupled to the power amplifier. The pre-distortion module includes one or more smaller versions of the power amplifier to generate a pre-distortion signal that compensates for any memory-effect present in the power amplifier.

In still another embodiment, the invention is a method for generating a pre-distortion signal for a power amplifier. The method includes using a pre-distortion module to generate a pre-distortion signal that compensates for any memory-effect or inertia present in the power amplifier. The pre-distortion signal can be a correction signal that can be matched to the non-linearity of the power amplifier device, and the pre-distortion signal can be input to the power amplifier device. The pre-distortion module can include one or more basic amplification cells that are the same as one or more basic amplification cells in the power amplifier. The power amplifier device and the pre-distortion module can be thermally coupled. The pre-distortion module can generate the pre-distortion signal according to the methods set forth below.

BRIEF DESCRIPTION OF THE DRAWINGS

The invention is illustrated in the figures of the accompanying drawings which are meant to be exemplary and not limiting, in which like references are intended to refer to like or corresponding part, and in which.

DETAILED DESCRIPTION

The present invention recognizes a need for improved systems and methods to linearize a power amplifier. In some embodiments, the systems and method are used where the input signal's frequency bandwidth is large (e.g., approximately one octave) and/or where the transmitting frequency can vary within its permissible range (e.g., frequency hopping). Changes in the transmitting frequency usually happen faster than conventional linearization circuits can react.

Figure 1:
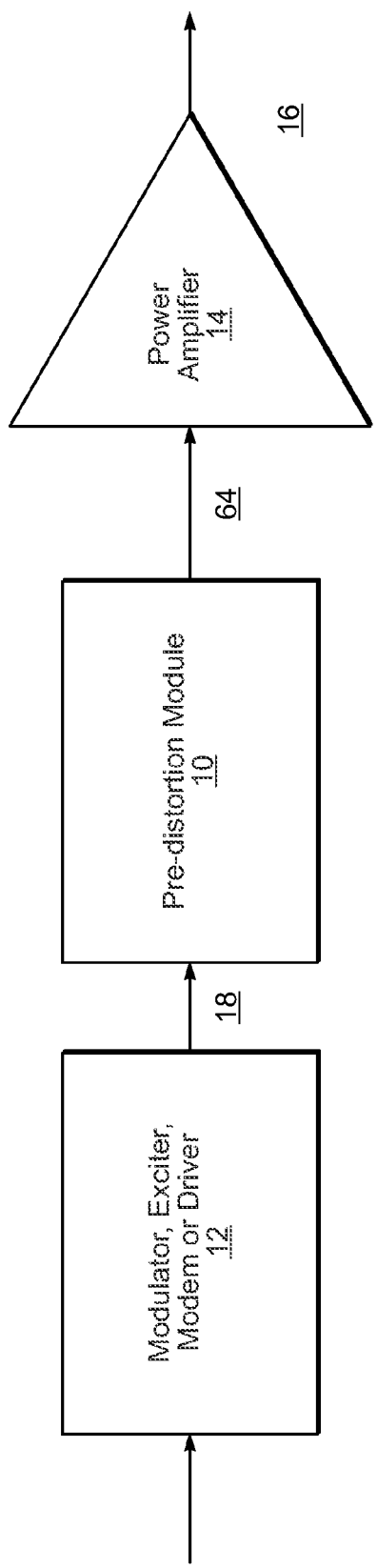
FIG. 1 is a system block diagram of a pre-distortion module incorporated with a power amplifier device according to a preferred embodiment of the disclosed subject matter.

To address this need, in one embodiment, the invention is a linearization system and method that has the same bandwidth and reaction time as the power amplifier which it intends to correct. FIG. 1 is a block diagram showing the placement of a pre-distortion module 10 configured in accordance with an embodiment of the present invention in the radio frequency (RF) chain 16 of a transmitter between a modulator, exciter, modem or driver circuit 12 and a power amplifier 14.

Figure 2:
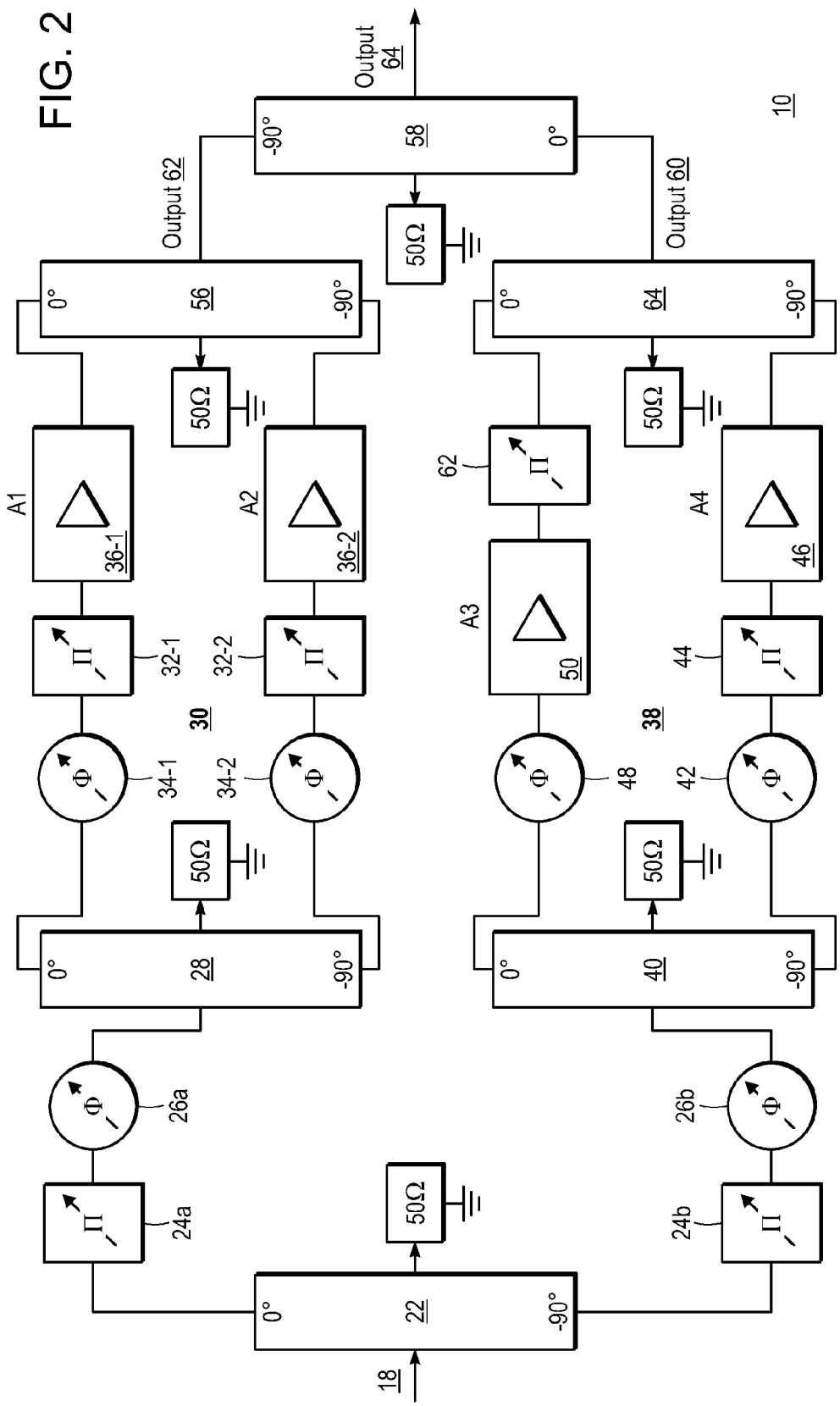
FIG. 2 is a system diagram of the pre-distortion module according to a preferred embodiment of the disclosed subject matter.

FIG. 2 is a block diagram showing an example of a pre-distortion module 10 configured in accordance with an embodiment of the present invention. This broadband pre-distortion module is based on a transversal (phase and amplitude) circuit structure that uses broadband components.

As shown in the illustration, the pre-distortion module receives a quasi distortion-free input signal 18 from any exciter, modulator, modem or driver (e.g., a digital or analog signal). The input signal is divided by a broadband coupler (or hybrid coupler) 22, which provides 0° and −90° signal components. The coupler 22 can be a 3 dB coupler and can be configured so that the input power is divided equally between the output ports. The isolated port is terminated to ground, as shown, through a 50Ω resistor. Similarly, the other couplers described below each has a port that is terminated to ground through a 50Ω resistor. Each of the 0° and −90° signal components from the coupler 22 are passed through an attenuator 24a, 24b, and a phase shifter 26a, 26b, to match each signal path to the most effective pre-distortion amplitude levels and phase (which may be determined empirically).

The 0° output of coupler 22, herein referred to as the linear path 30, is further split by a coupler 28 into 0° and −90° signal components. The coupler 28 can be, for example, a hybrid coupler. Each of the resulting signal components is subjected to phase adjustment through phase shifters 34-1, 34-2, and to attenuation through attenuators 32-1, 32-2, before being amplified by respective amplifier circuits 36-1, 36-2. The resulting components are then summed in a coupler 56 to produce an output signal 62. The coupler 56 can be, for example, a hybrid coupler. The resulting amplifier from the linear path has very low distortion or non-linearity and the same basic phase characteristic as the non-linear path, described below.

The −90° path or non-linear path 38, of the coupler 22 is where the pre-distortion signal is generated. As with the linear path, after attenuation and phase correction, the −90° signal is divided by a coupler 40 into 0° and −90° components. The coupler 40 can be, for example, a broadband, 3-dB hybrid coupler. The −90° component undergoes a phase adjustment through phase shifter 42, and a variable attenuation through attenuator 44, before being provided as an input to the amplifier 46. The attenuator 44 at the input of amplifier 46 ensures that the amplifier 46 will operate in its linear region and will have the appropriate level (as discussed below).

The 0° signal component from coupler 40 undergoes a phase adjustment through phase shifter 48 and is then provided as an input signal to amplifier 50, operating in similar mode as the power amplifier 14 to be corrected. The output from amplifier 50 is attenuated through attenuator 52 to adjust the level of the distorted signal.

The resulting output of the distortion path is combined at the −90° port of yet another coupler 54 with the output of amplifier 46 from the non-distorted path being provided at the 0° input thereof. The coupler 54 can be, for example, a 3-dB hybrid coupler. The output of the coupler 54 will be the subtraction of the non-distorted signal from the distorted signal, resulting in a signal 60 that closely matches the distortion of the final power amplifier 14 with a 180° phase shift.

The purpose of the various attenuators and the phase shifters discussed above is to properly adjust the level of the non-distorted signal with the distorted path and therefore cancel the linear portion of the non-linear signal. Combining this non-linear signal 60 with the linear signal 62 provided by the linear path 30 in a coupler 58, and adjusting the ratio and phase of distorted and non-distorted signals, will provide a correction signal 64 matched to the non-linearity of the power amplifier 14.

Broadband operation of a system employing the pre-distortion techniques discussed herein is assured because in each single path of the pre-distortion module all the components are the same and, therefore, do not require frequency dependent settings. Furthermore, the present invention provides the required bandwidth to operate a power amplifier and pre-distortion module with adjustments, allowing frequency hopping. The adjustments may be digitally controlled, may be fixed or adaptive (non-hopping applications), and allow for multiple operating points.

In embodiments of the present invention, the amplification devices used in the four signal paths of the pre-distortion module are, necessarily, composed of an arbitrary number of "basic amplification cells." A "basic amplification cell" is an elemental segment that, in aggregation, constitute(s) the main power amplifier device(s). So, for instance, if the main power amplifier device 14 used in the amplification path is a transistor (e.g., bipolar junction transistor (BJT), metal oxide semiconductor field effect transistor (MOSFET), lateral double diffused MOSFET (LDMOSFET), GaAs FET, GaN FET, etc.) comprised of N number of elemental transistors connected in combination, a fraction of N will be used as the "basic amplification cell" in the present pre-distortion module 10. The use of these fractional segments in the pre-distortion module 10 guarantees that the same physical characteristics of the power amplifier 14 are present in these devices. Using matched, elemental versions of the power amplifier 14 in the amplification paths of the pre-distortion module 10 maintains the pre-distortion bandwidth as the same or larger than the bandwidth of the power amplifier 14. Further, the combination of linear path amplification and non-linear path amplification allows for the correction of low level and high level distortions of the power amplifier 14. It also corrects for both amplitude modulation-to-amplitude modulation distortion and amplitude modulation-to-phase modulation distortion of the power amplifier 14. Finally, using characteristic-matched devices in both the power amplifier 14 and in the pre-distortion module 10 means that the temperature variation characteristics of both will also match, allowing for temperature independent optimized pre-correction by thermally coupling both.

Thus, improved techniques for linearizing broadband amplifiers have been described. In one example, the present system includes a pre-distortion module in combination with a power amplifier device that (a) uses a smaller version of the power amplifier device to generate the pre-distortion and therefore compensates for the memory-effect or inertia present in any given power amplifier (and, for the same reason, provides temperature compensation when both pre-distorting and power amplifying devices are thermally coupled); (b) has large percentage bandwidth, once it does not require frequency-dependant adjustments; (c) is suitable to operate in a multi-carrier environment; and (d) operates in frequency-hopping applications.

Although the invention has been described and illustrated in the foregoing illustrative embodiments, it is understood that the present disclosure has been made only by way of example, and that numerous changes in the details of implementation of the invention can be made without departing from the spirit and scope of the invention. Features of the disclosed embodiments can be combined and rearranged in various ways.

What is claimed is:

1. A system comprising:
a power amplifier; and
a pre-distortion module coupled with the power amplifier, wherein the pre-distortion module includes one or more smaller versions of the power amplifier to generate a pre-distortion signal that compensates for any memory-effect or inertia present in the power amplifier, wherein the pre-distortion module and the power amplifier are thermally coupled.

2. The system of claim 1, wherein the pre-distortion signal is a correction signal that is matched to the non-linearity of the power amplifier.

3. The apparatus of claim 1, wherein the one or more smaller versions of the power amplifier comprises one or more basic amplification cells that are the same as one or more basic amplification cells in the power amplifier.

4. The apparatus of claim 3, wherein the basic amplification cells comprise transistors.

5. The apparatus of claim 1, wherein the pre-distortion signal comprises a correction signal that is matched to the non-linearity of the power amplifier.

6. The apparatus of claim 1, wherein the pre-distortion module comprises a first coupler to split an input signal into at least two signal components, and wherein the coupler is coupled to a linear path and a non-linear path.

7. The apparatus of claim 6, wherein the at least two signal components are 0° and −90° signal components.

8. The apparatus of claim 7, wherein the pre-distortion module further comprises a second coupler coupled to the linear path and a third coupler coupled to the non-linear path, wherein the second coupler splits the 0° signal component into 0° and −90° components, and wherein the third coupler splits the −90° signal component into 0° and −90° components.

9. The apparatus of claim 8, wherein the linear path further comprises for each of the 0° and −90° components, at least one attenuator, at least one phase shifter, and at least one amplifier circuit, and further comprises at least a fourth coupler to combine the 0° and −90° components.

10. The apparatus of claim 9, wherein the non-linear path further comprises for each of the 0° and −90° components, at least one attenuator, at least one phase shifter, and at least one amplifier circuit, and further comprises at least a fifth coupler to combine the 0° and −90° components.

11. The apparatus of claim 10, wherein the pre-distortion module further comprises a sixth coupler to combine an output of the fourth coupler with an output of the fifth coupler to produce the pre-distortion signal.

12. The apparatus of claim 11, wherein the attenuators, phase shifters, and amplifier circuits are chosen to adjust a level of a non-distorted signal with a distorted signal to cancel the linear portion of the non-linear signal.

13. The apparatus of claim 1, further comprising an output circuit coupled to the pre-distortion module, wherein the output circuit outputs an input signal to the pre-distortion module, and wherein the output circuit is selected from the group consisting of a modulator, an exciter, a modem, and a driver circuit.

14. An apparatus comprising:
a power amplifier device; and
a pre-distortion module coupled with the power amplifier device, wherein the pre-distortion module can generate a pre-distortion signal, and wherein the pre-distortion module includes one or more basic amplification cells that are the same as one or more basic amplification cells in the power amplifier device, wherein the pre-distortion module and the power amplifier device are thermally coupled.

15. The apparatus of claim 14, wherein the pre-distortion module includes one or more smaller versions of the power amplifier device.

16. The apparatus of claim 14, wherein the basic amplification cells are transistors.

17. The apparatus of claim 14, wherein the pre-distortion signal compensates for a memory effect or inertia present in the power amplifier device.

18. The apparatus of claim 14, wherein the pre-distortion signal is a correction signal that is matched to the non-linearity of the power amplifier device.

19. An apparatus comprising:
a pre-distortion module, wherein the pre-distortion module is adapted for coupling to a power amplifier device during use,
wherein the pre-distortion module includes one or more basic amplification cells that are the same as one or more basic amplification cells in the power amplifier device to generate a pre-distortion signal for the power amplifier device, wherein the pre-distortion module is adapted for thermal coupling to the power amplifier device.

* * * * *